US008767973B2

(12) United States Patent
Andrea et al.

(10) Patent No.: US 8,767,973 B2
(45) Date of Patent: Jul. 1, 2014

(54) ADAPTIVE FILTER IN A SENSOR ARRAY SYSTEM

(75) Inventors: Douglas Andrea, Sag Harbor, NY (US); Leonard Shoell, Pleasant Grove, UT (US); Yehuda Mitelman, Ilit (IL)

(73) Assignee: Andrea Electronics Corp., Bohemia, NY (US)

( * ) Notice: Subject to any disclaimer, the term of this patent is extended or adjusted under 35 U.S.C. 154(b) by 0 days.

(21) Appl. No.: 13/291,565

(22) Filed: Nov. 8, 2011
(Under 37 CFR 1.47)

(65) Prior Publication Data

US 2012/0057719 A1 Mar. 8, 2012

Related U.S. Application Data

(63) Continuation of application No. 12/332,959, filed on Dec. 11, 2008, now Pat. No. 8,150,054.

(60) Provisional application No. 61/012,884, filed on Dec. 11, 2007, provisional application No. 61/048,142, filed on Apr. 25, 2008.

(51) Int. Cl.
*H03B 29/00* (2006.01)
*H04R 3/00* (2006.01)

(52) U.S. Cl.
USPC .......................................... 381/71.11; 381/92

(58) Field of Classification Search
None
See application file for complete search history.

(56) References Cited

U.S. PATENT DOCUMENTS

| | | | | |
|---|---|---|---|---|
| 4,025,724 | A * | 5/1977 | Davidson et al. | 381/71.2 |
| 4,088,849 | A | 5/1978 | Usami et al. | |
| 4,956,867 | A * | 9/1990 | Zurek et al. | 381/94.7 |
| 5,463,694 | A | 10/1995 | Bradley et al. | |
| 5,610,991 | A * | 3/1997 | Janse | 381/92 |
| 5,815,582 | A | 9/1998 | Claybaugh et al. | |
| 5,825,897 | A | 10/1998 | Andrea et al. | |
| 6,118,878 | A | 9/2000 | Jones | |
| 6,430,295 | B1 | 8/2002 | Handel et al. | |
| 6,430,296 | B1 | 8/2002 | Olsen | |
| 6,449,586 | B1 * | 9/2002 | Hoshuyama | 702/190 |
| 6,728,380 | B1 * | 4/2004 | Zhu et al. | 381/71.4 |
| 6,959,092 | B1 * | 10/2005 | Berkhoff et al. | 381/71.1 |
| 7,054,452 | B2 * | 5/2006 | Ukita | 381/92 |
| 7,065,219 | B1 | 6/2006 | Abe et al. | |
| 7,092,529 | B2 | 8/2006 | Yu et al. | |
| 7,142,677 | B2 * | 11/2006 | Gonopolskiy et al. | 381/92 |
| 7,155,019 | B2 * | 12/2006 | Hou | 381/92 |
| 7,346,175 | B2 | 3/2008 | Hui et al. | |
| 7,415,117 | B2 | 8/2008 | Tashev et al. | |
| 7,471,798 | B2 | 12/2008 | Warren | |
| 7,475,014 | B2 | 1/2009 | Smaragdis et al. | |
| 7,478,041 | B2 | 1/2009 | Ichikawa et al. | |
| 7,630,502 | B2 | 12/2009 | Beaucoup et al. | |

(Continued)

FOREIGN PATENT DOCUMENTS

| | | | |
|---|---|---|---|
| WO | WO 2006/028587 | A2 | 3/2006 |
| WO | WO 2008/146082 | A2 | 12/2008 |
| WO | WO 2008/157421 | A1 | 12/2008 |

*Primary Examiner* — Robert W Horn

(74) *Attorney, Agent, or Firm* — Vedder Price, P.C.; Thomas J. Kowalski; Rebecca G. Rudich

(57) ABSTRACT

Disclosed is a steerable sensor array that receives input from a target and applies an averaging filter. An adaptive filter is then used if the SNR of the output of the averaging filter reaches a threshold.

8 Claims, 7 Drawing Sheets

Beam Forming Algorithm

(56) References Cited

U.S. PATENT DOCUMENTS

| | | | | |
|---|---|---|---|---|
| 7,711,127 | B2 | 5/2010 | Suzuki et al. | |
| 7,720,679 | B2 | 5/2010 | Ichikawa et al. | |
| 7,769,186 | B2 | 8/2010 | Stokes et al. | |
| 7,803,050 | B2 | 9/2010 | Mao et al. | |
| 7,809,145 | B2 | 10/2010 | Mao | |
| 7,817,805 | B1 | 10/2010 | Griffin | |
| 8,150,054 | B2 * | 4/2012 | Andrea et al. | 381/71.11 |
| 8,160,261 | B2 | 4/2012 | Schulein et al. | |
| 2004/0001598 | A1 * | 1/2004 | Balan et al. | 381/92 |
| 2004/0161121 | A1 * | 8/2004 | Chol et al. | 381/92 |
| 2004/0165735 | A1 | 8/2004 | Opitz | |
| 2005/0207585 | A1 | 9/2005 | Christoph | |
| 2005/0281415 | A1 * | 12/2005 | Lambert et al. | 381/92 |
| 2006/0222184 | A1 * | 10/2006 | Buck et al. | 381/71.1 |
| 2006/0233389 | A1 * | 10/2006 | Mao et al. | 381/92 |
| 2006/0239471 | A1 | 10/2006 | Mao et al. | |
| 2006/0270468 | A1 | 11/2006 | Hui et al. | |
| 2007/0023851 | A1 | 2/2007 | Hartzell et al. | |
| 2007/0223731 | A1 * | 9/2007 | Togami et al. | 381/92 |
| 2007/0287380 | A1 | 12/2007 | Hui et al. | |
| 2008/0152161 | A1 | 6/2008 | Kim et al. | |
| 2008/0159559 | A1 * | 7/2008 | Akagi et al. | 381/92 |
| 2008/0175408 | A1 | 7/2008 | Mukund et al. | |
| 2008/0187152 | A1 * | 8/2008 | Kim et al. | 381/92 |
| 2008/0232607 | A1 | 9/2008 | Tashev et al. | |
| 2008/0317259 | A1 * | 12/2008 | Zhang et al. | 381/92 |
| 2009/0103749 | A1 | 4/2009 | Goodwin | |
| 2009/0129608 | A1 | 5/2009 | Puder | |
| 2009/0129609 | A1 | 5/2009 | Oh et al. | |
| 2009/0190774 | A1 | 7/2009 | Wang et al. | |
| 2009/0208028 | A1 | 8/2009 | Andrea et al. | |
| 2009/0268931 | A1 | 10/2009 | Andrea et al. | |
| 2010/0008518 | A1 | 1/2010 | Mao | |
| 2011/0129097 | A1 | 6/2011 | Andrea | |
| 2012/0057719 | A1 * | 3/2012 | Andrea et al. | 381/71.11 |

* cited by examiner

ADAPTIVE FILTER IN A SENSOR ARRAY SYSTEM

INCORPORATION BY REFERENCE

The present application is a continuation of U.S. application Ser. No. 12/332,959, filed Dec. 11, 2008, now U.S. Pat. No. 8,150,054, which claims the benefit of Provisional Application Number 61/012,884 filed Dec. 11, 2007. The present application also makes reference to Provisional Application Number 61/048,142 filed Apr. 25, 2008. All of these applications are incorporated herein by reference.

Each document cited in this text ("application cited documents") and each document cited or referenced in each of the application cited documents, and any manufacturer's specifications or instructions for any products mentioned in this text and in any document incorporated into this text, are hereby incorporated herein by reference; and, technology in each of the documents incorporated herein by reference can be used in the practice of this invention.

BACKGROUND

In recent years, there has been a dramatic increase in the number of applications using voice communications. For instance, the Internet has allowed individuals to make telephone calls through a computer, or to talk to other people participating in an online multiplayer game.

Traditionally, an individual who wishes to such voice application usually use headsets with close talking boom microphones. However, prolonged use of such a microphone can be very inconvenient to an individual. An individual wearing a supposed comfortable microphone can find the prolonged use of such a microphone uncomfortable. Alternatively, microphones can be built into a computer or monitor, or may be an external device which is attached to a computer or monitor. Due to the distance between such microphones and the user, such microphones must be able to receive input from a greater area. As a consequence, such microphones are also subject to picking up increased background noise.

Accordingly, there is a need for a high fidelity far field noise canceling microphone that possesses good background noise cancellation and that can be used in any type of noisy environment, especially in environments where a lot of music and speech is present as background noise (as in a game arena or internet café), and a microphone that does not need the user to have to deal with positioning the microphone from time to time. Therefore, an object of the present invention provide for an integrated array of microphones utilizing an adaptive beam forming algorithm. Such an invention does not require an individual to wear a microphone headset and allows a large degree of freedom. Further, such a microphone array allows a user to electronically steer the microphone's beam, or the area in which it accepts voice input, as opposed to having to physically steer the microphone array.

SUMMARY OF THE INVENTION

The present invention relates to a sensor array having adaptive filtering capabilities and methods of using the same to reduce background and related noise. The sensor array receives digital input from a number of channels. First an averaging filter is applied to the input of each channel. The signal-to-noise ratio (SNR) of the output of the averaging filter is calculated. Depending on the SNR, a second filter, namely an adaptive filter would then be applied to the output of the averaging filter. The coefficients of this adaptive filter are updated on the basis of several calculated parameters such as a calculation of the beam of the sensor, a beam reference, a reference average, and noise estimation. These calculations are done on a continuous basis and the adaptive filter coefficients are also continuously updated.

The averaging filter and adaptive filter may be implemented on a digital signal processor or DSP. In other embodiments, general microprocessors, such as those found in computers maybe used to perform the digital processing to implement filtering.

The sensor array itself can be made of microphones. If analog microphones are used the input must be digitized before the digital filtering begins. Alternatively, Digital microelectromechanical systems (MEMS) microphones can be used, wherein the microphone itself digitizes the input. As used herein, the terms microphone array and sensor array are used interchangeably. Any embodiments described as referring to a microphone array are equally applicable to a sensor array, and vice versa.

DETAILED DESCRIPTION

According to an embodiment of the current invention, a sensor array receives signals from a source. The digitized output of the sensors is then transformed using a discrete Fourier transform (DFT).

Figure 1:
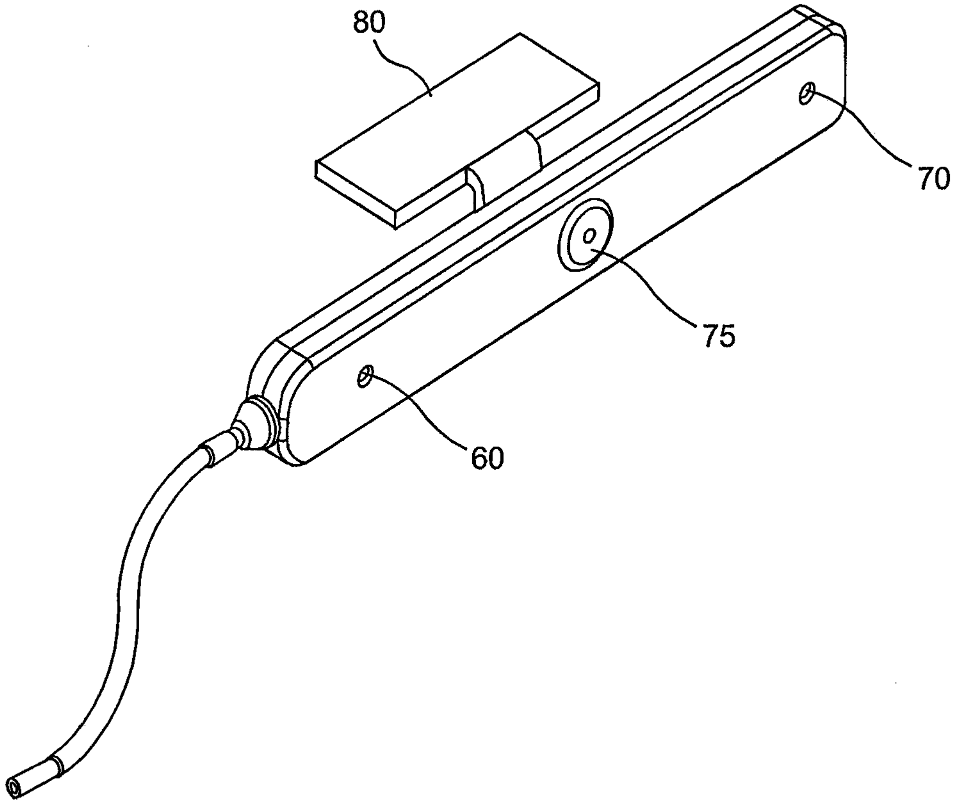
FIG. 1 is a drawing of a sensor array according to one embodiment of the invention.

The sensors of the sensor array preferably will consist of, but are not limited to, microphones. In one embodiment the microphones will be aligned on a particular axis. In the simplest embodiment, as shown in FIG. 1, the array will comprise two microphones, 60 and 70 on a straight line axis. Normally, the array will consist of an even amount of sensors, with the sensors, according to one embodiment, a fixed distance apart from each adjacent sensor. The sensor array can be designed with a mount 80 to sit or attach to or on a computer monitor or similar.

Advantageously, a video camera 75 or some other type of device or sensor may fit or be located in-between the two most center microphones of the sensor array such that there is an equal amount of microphones on each side of the video camera or other device. According to an embodiment of the invention, the microphones generally will be positioned horizontally, and symmetrically with respect to a vertical axis. In such an arrangement there are two sets of microphones, one on each side of the vertical axis corresponding to two separate channels, a left and right channel, for example.

In certain embodiments, the microphones will be digital microphones such as uni or omni-directional electret microphones, or micro machined micro electromechanical systems (MEMS) microphones. The advantage of using the MEMS microphones is that they have silicon circuitry that internally converts an analog audio signal into a digital signal without the need of an A/D converter, as other microphones would require in other embodiments of this invention. In any event, after the received audio signals are digitized, according to an embodiment of the present invention, the signals travel through adjustable delay lines that act as input into a microprocessor or a DSP. The delay lines are adjustable, such that a user can control the beam of the array. In one embodiment, the delay lines are fed into the microprocessor of a computer. In such an embodiment, as well as others described herein, there may be a graphical user interface (GUI) that provides feedback to a user. For example, the interface can tell the user the width of the beam produced from the array, the direction of the beam, and how much sound it is picking up from a source. Based on input from a user of the electronic device containing the microphone array, the user can vary the delay lines that carry the output of the digitizer or digital microphone to the microprocessor or DSP. As is well known in the areas of sensor array or antenna array technology, by changing the delay lines from the sensors, the direction of the beam can be changed. This allows a user then to steer the beam. For example, the microphone array might by default produce a beam direction that is directly straightforward from the microphone array. But if the target signal is not directly ahead of the sensor array, but instead at an angle with respect to the sensor array, it would extremely helpful for the user to steer the beam in the direction of the target source. Allowing a person to steer the beam through electronic beams is more efficient than requiring the manual movement of the device containing the sensor array. The steering ability allows the sensor array, including a microphone array, itself to be small and compact without requiring parts to physically move the sensors. In the case of an embodiment for use with a computer system or other similar electronic device, the software receiving the input would process the input through the GUI and properly translate the commands of user to accordingly adjust the delay lines to the user's wishes. The beam may be steered before any input or anytime after the sensor array or microphones receive input from a source.

Figure 2:
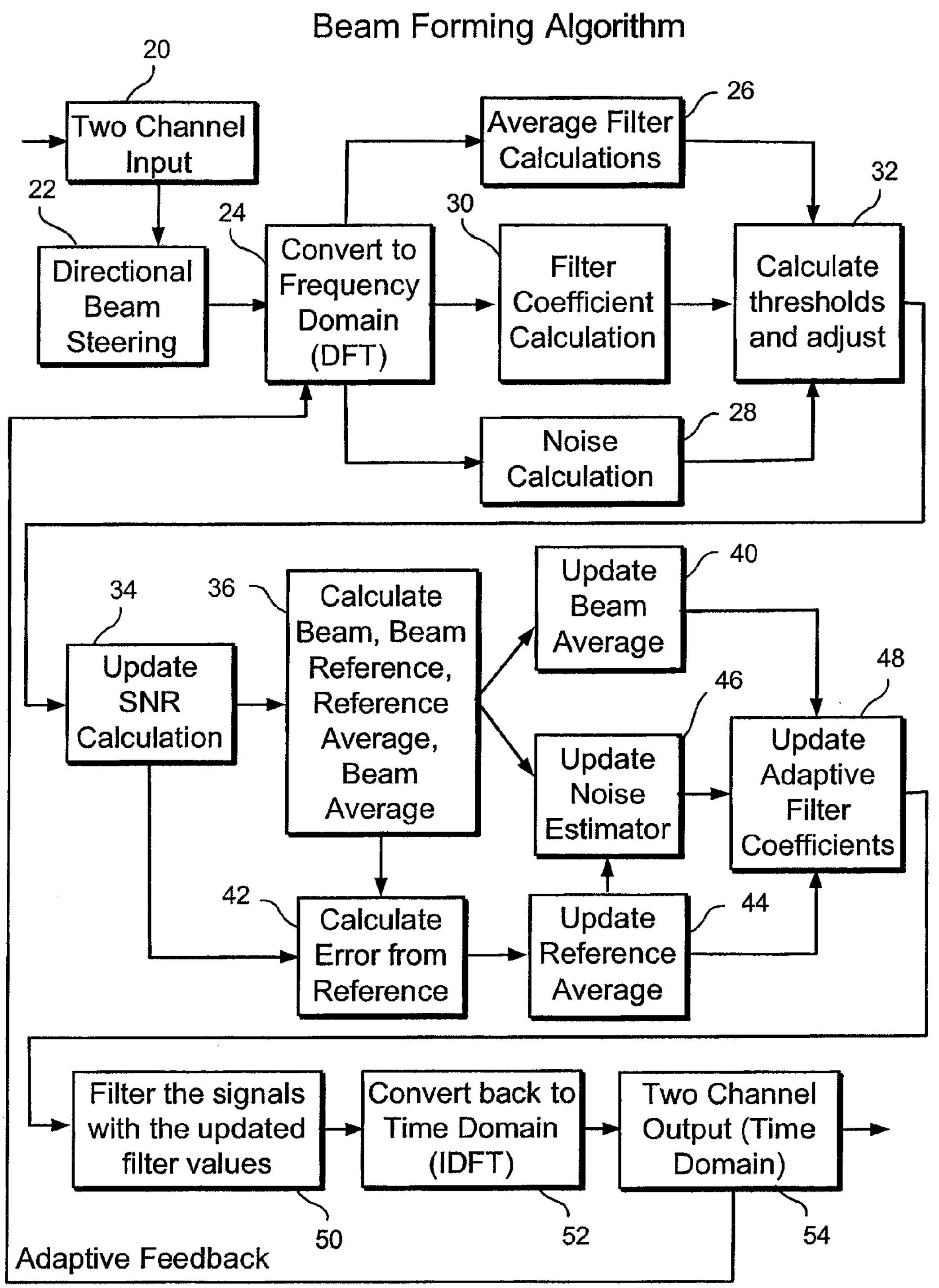
FIG. 2 is a schematic depicting the beam forming algorithm according to one embodiment of the invention.

The present invention, according to one embodiment as presented in FIG. 2, produces substantial cancellation or reduction of background noise. After the steerable microphone array produces a two-channel input signal that is digitized 20 and on which beam steering is applied 22, the output is transformed using a DFT 24. It is well known in the art that there are many algorithms that can perform a DFT. In particular, a fast Fourier transform (FFT) maybe used to efficiently transform the data so that it is more amenable for digital processing. As mentioned previously, the DFT processing can take place in a general microprocessor, or a DSP. After transformation, the data can be filtered according to the embodiment of FIG. 2.

This invention applies an adaptive filter in order to greatly filter out background noise. The key is the way in which the adaptive filter is composed and in particular how the coefficients that make up the filter are produced. The adaptive filter is a mathematical transfer function. In one embodiment presented, the filter coefficient is dependent on the past and present digital input.

An embodiment as shown in FIG. 2 discloses an averaging filter that is first applied to the digitally transformed input in order to smooth the digital input and remove high frequency artifacts 26. This is done for each channel. In addition, the noise from each channel is also determined 28. Once the noise is determined, different variables can be calculated to update the adaptive filter coefficients. The channels are averaged and compared against a calibration threshold 32. Such a threshold is usually set by the manufacturer. If the result falls below a threshold, the values are adjusted by a weighting average function such as to reduce distortion by a phase mismatch between the channels.

Another parameter calculated, according the embodiment in FIG. 2, is the signal to noise ratio (SNR). The SNR is calculated from the averaging filter output and the noise calculated 34 from each channel. The result of the SNR calculation if it reaches a certain threshold will trigger modifying the digital input using the filter coefficients of the previous calculated beam. The threshold, which is typically set by the manufacturer, is a value in which the output may be sufficiently reliable for use in certain applications. In different situations or applications, a higher SNR may be desired, and the threshold may be adjusted by an individual.

The beam for each input is continuously calculated. A beam is calculated as the average of signals, for instance, of two signals from a left and right channel, the average including the difference of angle between the target source and each channel. Along with the beam, a beam reference, reference average, and beam average are also calculated 36. The beam reference is a weighted average of a previous calculated beam and the adaptive filter coefficients. A reference average is the weighted sum of the previous calculated beam references. Furthermore, there is also a calculation for beam average, which is the running average of previous calculated beams. All these factors are used to update the adaptive filter.

Using the calculated beam and beam average, an error calculation is performed by subtracting the current beam from the beam average 42. This error is then used in conjunction with an updated reference average 44 and updated beam average 40 in a noise estimation calculation 46. The noise calculation helps predict the noise from the system including the filter. The noise prediction calculation is used in updating the coefficients of the adaptive filter 48 such as to minimize or eliminate potential noise.

After updating the filter and applying the digital input to it, the output of the filter is then processed by an inverse discrete Fourier transform (IDFT). After the IDFT, the output then may be used in digital form as input into an audio application, such as audio recording, voice over internet protocol (VOIP), speech recognition, or the output can be sent as input to another, separate computing system for additional processing.

According to another embodiment, the digital output from the adaptive filter may be reconverted by a D/A converter into an analog signal and sent to an output device. In the case of an audio signal, the output from the filter can be sent as input to another computer or electronic device for processing. Or it may be sent to an acoustic device such as a speaker system, or headphones for example.

The algorithm, as disclosed herein, is advantageously able to effectively filtering of noise, including non-stationary noise or sudden noise such as a door slamming. Furthermore, the algorithm allows superior filtering at lower frequencies while also allowing the spacing between elements in the array, i.e., between microphones, to be small, including as little as 2 inches or 50 mm in a two element microphone embodiment. Previously, microphones arrays would require substantially greater spacing, such as a foot or more between elements to be able to have the same amount filtering at the lower frequencies.

Another advantage of the algorithm as presented is that it, for the most part, requires no customization for a wide range of different spacings between the elements in the array. The algorithm is robust and flexible enough to automatically adjust and handle the element spacing a microphone array system might be required to have in order to work in conjunction with common electronic or computer devices.

Figure 3:
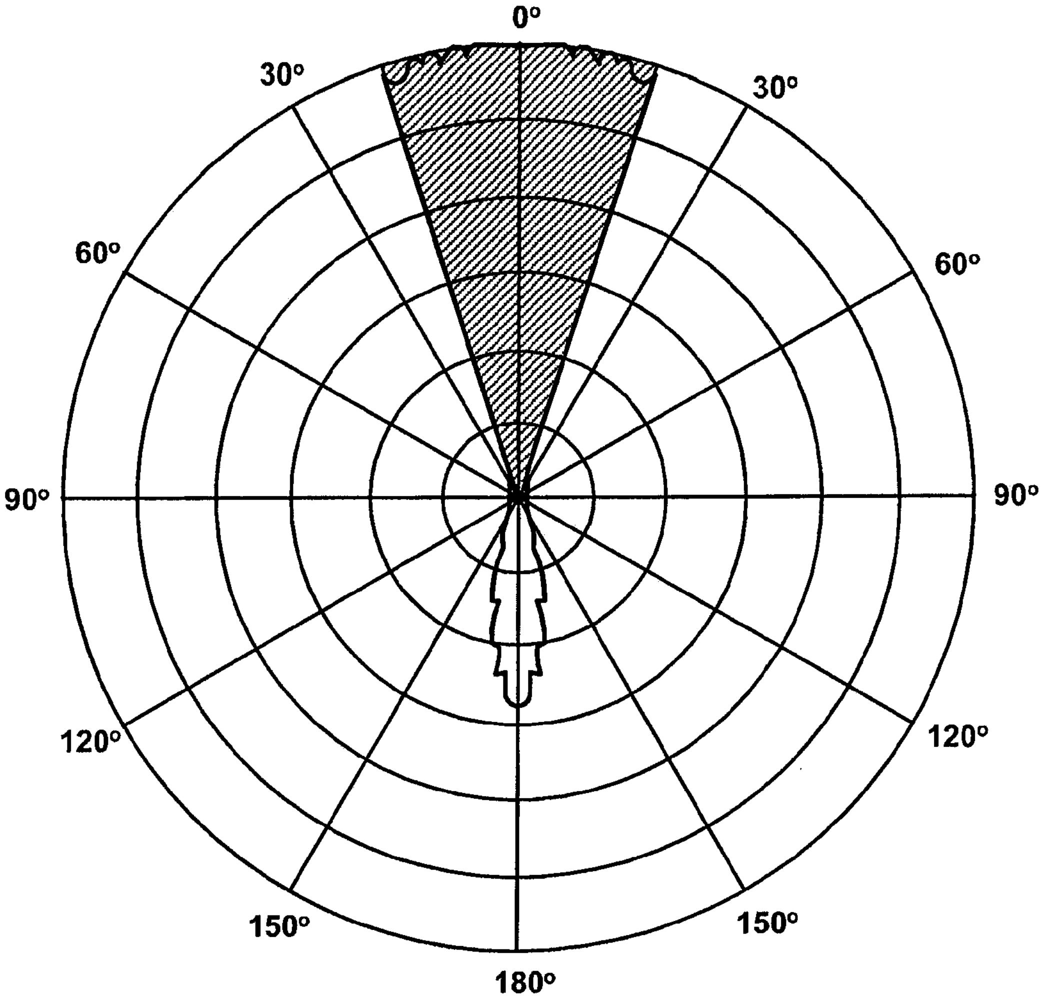
FIG. 3 is a drawing depicting a polar beam plot of a 2 member microphone array according to one embodiment of the invention.
Figure 4:
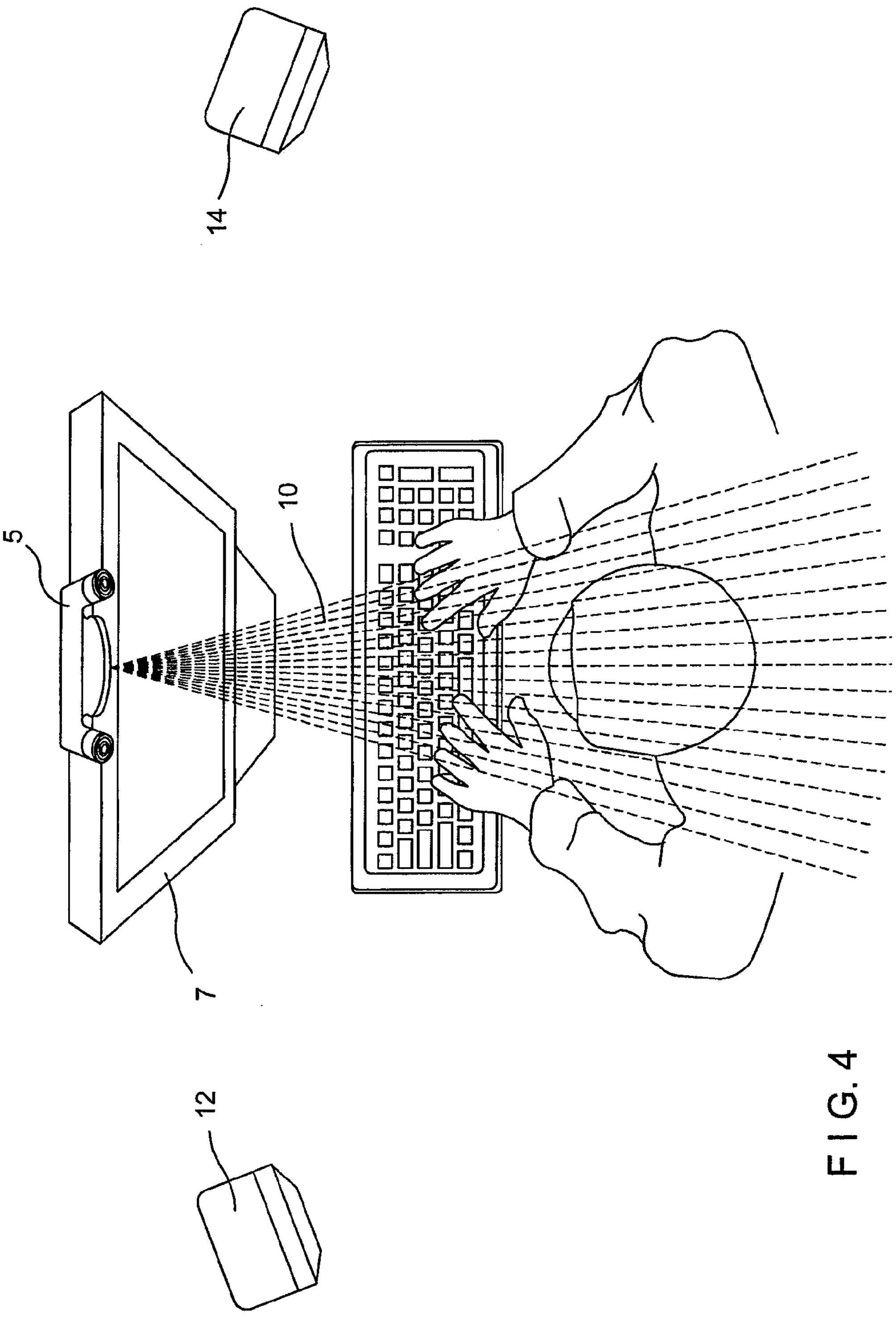
FIG. 4 is a drawing depicting the corresponding beam to the polar plot of FIG. 3 according to one embodiment of the invention.

FIG. 3 shows a polar beam plot of a 2 member microphone array according to an embodiment of the invention wherein the delays lines of the left and right channels are equal. FIG. 4 shows the corresponding beam as shown in the polar plot of FIG. 3 in an embodiment where the microphone array is used in conjunction with a computer system. The microphone array is placed a top a monitor in FIG. 4. In such an embodiment, the speakers are placed outside of the main beam. Because of the superior performance of the microphone array system, the array attenuates signals originating from sources outside of the main beam, such as the speakers as shown in FIG. 4, such that microphone array effectively acts as an echo canceller with there being no feedback distortion.

Figure 5:
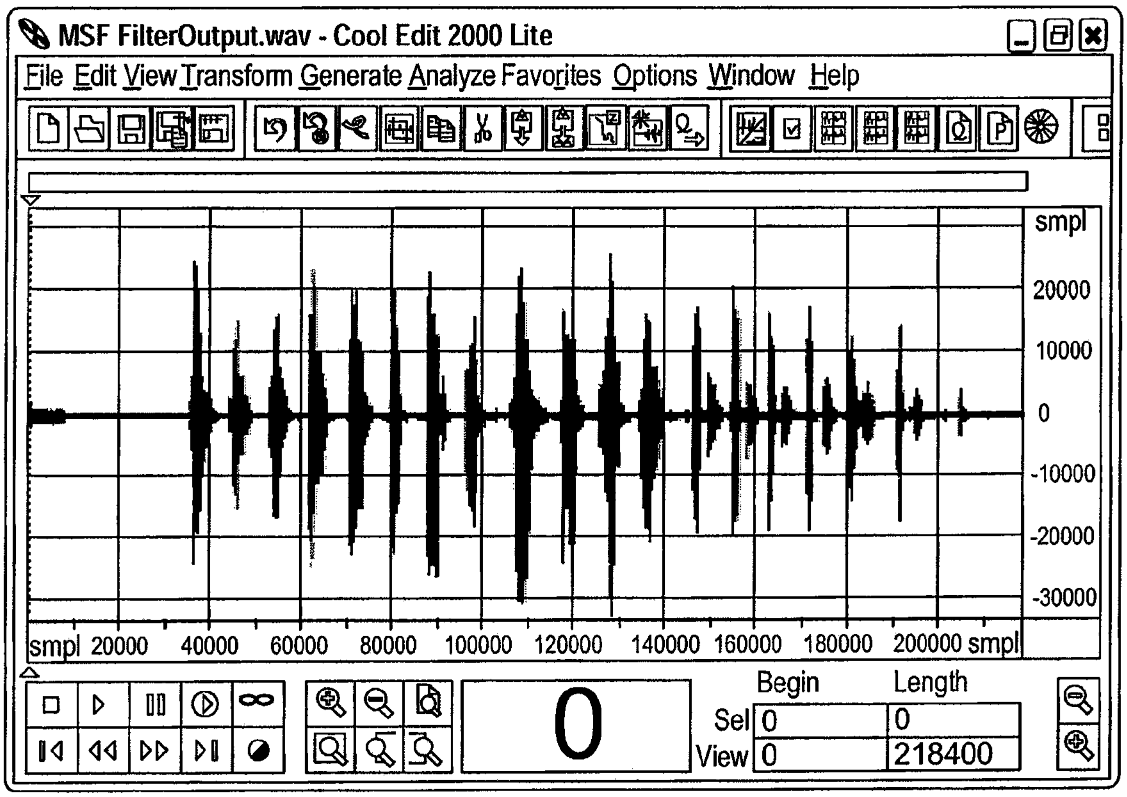
FIG. 5 depicts a comparison between the filtering of Microsoft array filter with an array filter disclosed according to an embodiment of the present invention.
Figure 5:
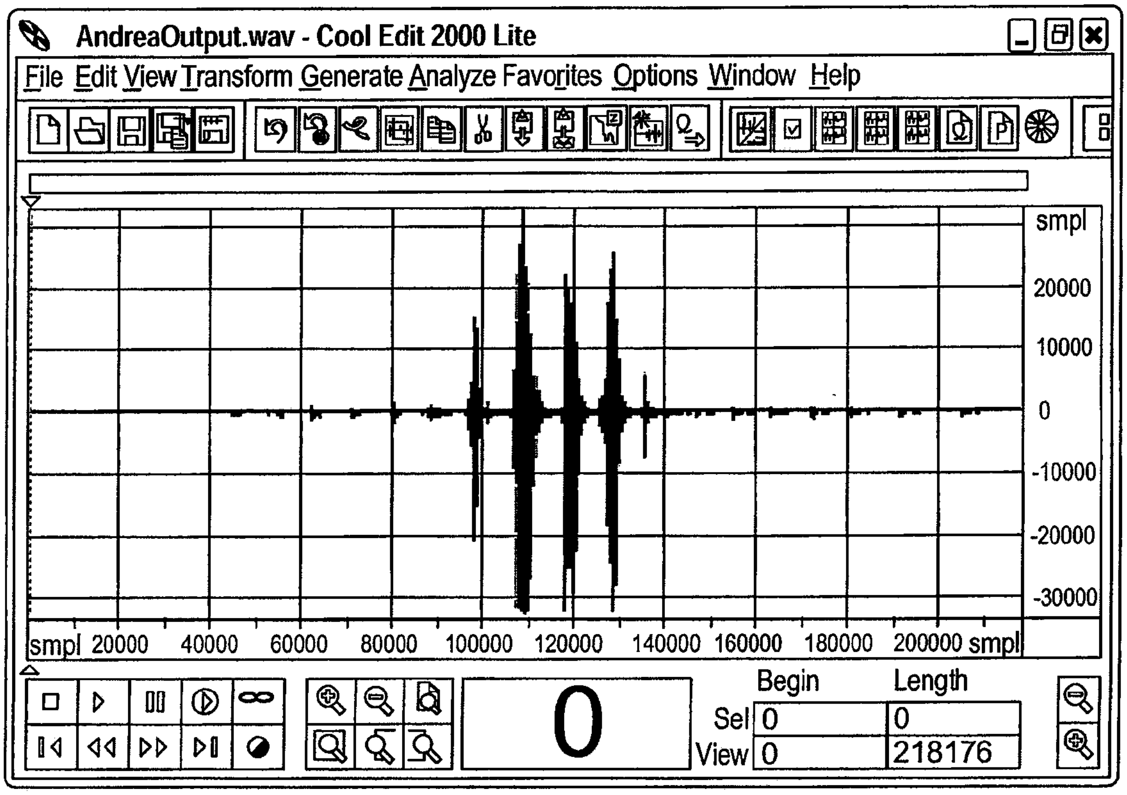

The beam typically will be focused narrowly on the target source, which is typically the human voice, as depicted in FIG. 4. When the target source moves outside the beam width, the input of the microphone array shows a dramatic decrease in signal strength as shown in FIG. 5. The 12,000 mark on the axis represents a target source or input source directly in front of the microphone array. The 10,000 mark and 14,000 mark correspond to the outer parts of the beam as shown in FIGS. 3 and 3. FIG. 5 shows, for example, a comparison between the filtering of a Microsoft array filter with an array fitter according to an embodiment of the present invention. As soon as the target source falls outside of the beam width, or at the 10,000 or 14,000 marks, there is a very noticeable and dramatic roll off in signal strength in the microphone array using an embodiment of the present invention. By contrast, there is no such roll off found in the Microsoft array filter.

As one of skill in the art would recognize, in the invention as disclosed, the sensor array could be placed on or integrated within different types of devices such as any devices that require or may use an audio input, such a computer system, laptop, cellphone, global positioning system, audio recorder, etc. For instance, in a computer system embodiment, the microphone array may be integrated, wherein the signals from the microphones are carried through delay lines directly into the computer's microprocessor. The calculations performed for the algorithm described according to an embodiment of the present invention may take place in a microprocessor, such as an Intel Pentium Processor, typically used for personal computers. Alternatively, the processing may be done by a digital signal processor (DSP). The microprocessor or DSP may be used to handle the user input to control the adjustable lines and the beam steering.

Alternatively, in a computer system embodiment, the microphone array and the delay lines can be connected, for example, to a USB input instead of being integrated with a computer system. In such an embodiment, the signals may then be routed to the microprocessor, or it may be routed to a separate DSP chip that is also connected to the same or different computer system for digital processing. The microprocessor of the computer in such an embodiment could still run the GUI that allows the user to control the delays and thus control the steering of the beam, but the DSP will perform the appropriate filtering of the signal according to an embodiment of an algorithm presented herein.

In some embodiments, the spacing of the microphones in the sensor array maybe adjustable. By adjusting the spacing, the directivity and beam width of the sensor can be modified. In some embodiments, if a video sensor or camera is placed in the center of the microphone array it may be preferable to have the beam width the same as the optical viewing angle of the video camera or sensor.

Figure 6:
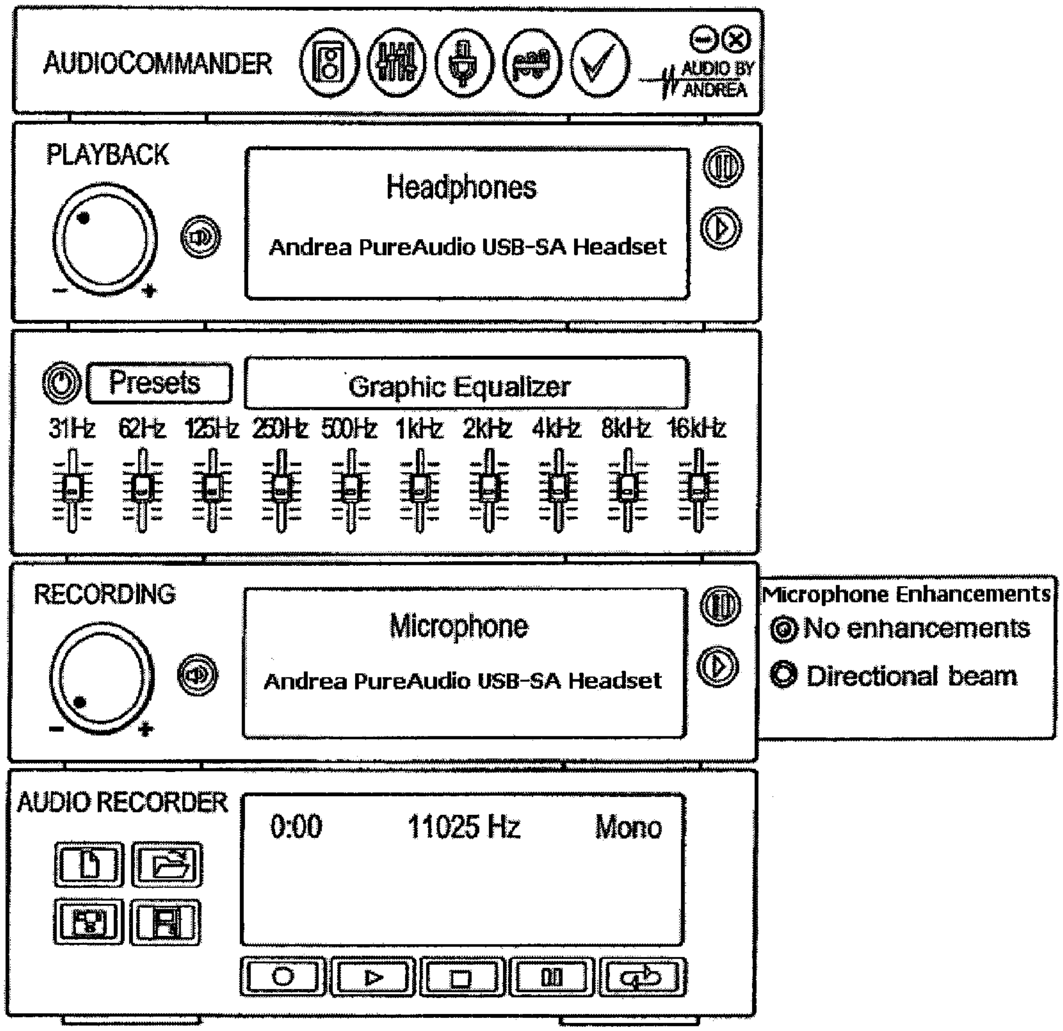
FIG. 6 is a depiction of an example of a visual interface that can be used in accordance with the present invention.
Figure 7:
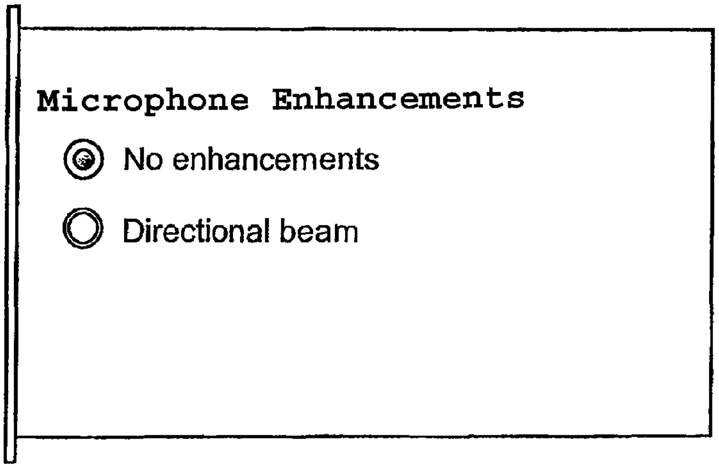
FIG. 7 is a depiction of an example of a visual interface that can be used in accordance with the present invention.

Additional drawings shown in FIGS. 6 and- 7 depict alternate visual user interfaces that be used with the invention as disclosed. FIG. 7 is a portion of the visual interface as shown in FIG. 5.

Having thus described in detail preferred embodiments of the present invention, it is to be understood that the invention defined by the foregoing paragraphs is not to be limited to particular details and/or embodiments set forth in the above description, as many apparent variations thereof are possible without departing from the spirit or scope of the present invention.

The invention claimed is:

1. A sensor array device, comprising:

a sensor array having at least two sensors, the sensor array having one or more channels;

a processing means connected to the sensor array receiving electrical signals representing output of the sensor array, said processing means comprising:

means for applying an adaptive filter to the electrical signals;

means for applying an averaging filter to the electrical signals;

means for calculating current filter coefficients of a beam representing the electrical signals, a beam reference, a reference average, and a noise estimation based on the output of the averaging filter to update the filter coefficients of the adaptive filter; and means for optionally applying the adaptive filter to the output of the averaging filter wherein coefficients of the adaptive filter applied to the output of the averaging filter are updated based on one or more of the calculated current filter coefficients of the beam representing the electrical signals, the calculated beam reference, the calculated reference average and the calculated noise estimation.

2. The sensor array device of claim 1, further comprising means for calculating the signal-to-noise ratio of the output of the averaging filter.

3. The sensor array device of claim 2, wherein the adaptive filter is applied if the signal-to-noise ratio of the output of the averaging filter reaches a set threshold.

4. The sensor array device of claim 1, further comprising means for allowing a user to steer a beam direction of the sensor array by adjusting delay lines in the sensor array device.

5. The sensor array device of claim 1, wherein the sensors in the sensor array are digital microphones.

6. The sensor array device of claim 5, wherein said microphones are a uni or omni-directional electret microphone, or a microelectromechanical systems (MEMS) microphone.

7. The sensor array device of claim 1, wherein a computer receives the electrical signals from the sensor array and one or more microprocessors of the computer performs the calculations to apply the averaging filter and the adaptive filter.

8. The sensor array device of claim 1, wherein a DSP performs the calculations to apply the averaging filter and the adaptive filter.

* * * * *